(12) United States Patent
Vali et al.

(10) Patent No.: US 7,173,856 B2
(45) Date of Patent: Feb. 6, 2007

(54) SENSE AMPLIFIER FOR A NON-VOLATILE MEMORY DEVICE

(75) Inventors: Tommaso Vali, Latina (IT); Giovanni Santin, Cittaducale (IT); Michele Incarnati, Gioia dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 10/912,520

(22) Filed: Aug. 5, 2004

(65) Prior Publication Data

US 2005/0237810 A1    Oct. 27, 2005

(30) Foreign Application Priority Data

Apr. 21, 2004    (IT) .......................... RM2004A0199

(51) Int. Cl.
*G11C 16/06* (2006.01)
*G11C 7/02* (2006.01)

(52) U.S. Cl. .................. 365/185.21; 365/208; 327/51; 327/54

(58) Field of Classification Search ............ 365/185.21
See application file for complete search history.

(56) References Cited

U.S. PATENT DOCUMENTS

| 4,823,031 | A | * | 4/1989 | Kadakia ....................... 327/51 |
| 4,982,363 | A | * | 1/1991 | Sood ....................... 365/189.01 |
| 6,137,741 | A | * | 10/2000 | Liu ............................. 365/208 |
| 6,507,222 | B1 | * | 1/2003 | Jensen et al. .................. 327/51 |
| 6,608,788 | B2 | | 8/2003 | Ma et al. |
| 6,643,178 | B2 | * | 11/2003 | Kurihara ................. 365/185.21 |
| 6,671,206 | B2 | | 12/2003 | Vali et al. |
| 6,771,551 | B1 | | 8/2004 | Terzioglu et al. |
| 6,813,190 | B2 | * | 11/2004 | Marotta et al. .......... 365/185.2 |
| 6,845,047 | B2 | | 1/2005 | Ikehashi et al. |
| 6,856,536 | B2 | | 2/2005 | Rinerson et al. |
| 6,859,405 | B2 | | 2/2005 | Lee et al. |
| 6,876,595 | B2 | | 4/2005 | Bhavnagarwala et al. |
| 2003/0016580 | A1 | | 1/2003 | Ma et al. |
| 2003/0072205 | A1 | | 4/2003 | Ma et al. |
| 2004/0076070 | A1 | | 4/2004 | Kim et al. |
| 2004/0085844 | A1 | | 5/2004 | Arimoto et al. |
| 2005/0047235 | A1 | | 3/2005 | Noh |

FOREIGN PATENT DOCUMENTS

EP    0 936 620 A1    8/1999
EP    1 049 102 A2    11/2000

* cited by examiner

*Primary Examiner*—Son L. Mai
(74) *Attorney, Agent, or Firm*—Leffert Jay & Polglaze, P.A.

(57) ABSTRACT

The memory device has a plurality of memory cells each coupled to a bitline. A feedback transistor is coupled to the bitline and provides voltage feedback on the bitline's precharge status. A biasing transistor is coupled to the feedback transistor. The biasing transistor provides a bias voltage to the feedback transistor in response to a reference voltage on the biasing transistor. A cascode-connected transistor is coupled to the feedback transistor and the biasing transistor. This transistor provides a stable bias voltage to the biasing transistor. An output latch circuit is coupled to the bitline for providing a latched output of the memory cell's data.

27 Claims, 3 Drawing Sheets

SENSE AMPLIFIER FOR A NON-VOLATILE MEMORY DEVICE

RELATED APPLICATION

This application claims priority to Italian Patent Application Serial No. RM2004A000199, filed Apr. 21, 2004, entitled "SENSE AMPLIFIER FOR A NON-VOLATIVE MEMORY DEVICE," which is commonly assigned.

TECHNICAL FIELD OF THE INVENTION

The present invention relates generally to memory devices and in particular the present invention relates to sense amplifiers in non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

In order to maintain system performance, the performance of flash memory transistors needs to increase as the performance of computer systems increase. One critical circuit that determines flash memory performance is the sense amplifier and related circuitry. Memory access time depends on the speed of the sense amplifier and sensing scheme. For example, in a cellular telephone, a fast flash memory access time improves overall telephone operating speed, the capability to perform parallel operations, and the amount of data that can be handled.

For the reasons stated above, and for other reasons stated below that will become apparent to those skilled in the art upon reading and understanding the present specification, there is a need in the art for a higher performance flash memory device.

SUMMARY

The above-mentioned problems with flash memory performance and other problems are addressed by the present invention and will be understood by reading and studying the following specification.

The present invention encompasses a sense amplifier in a non-volatile memory device. The memory device has a plurality of memory cells each coupled to a bitline.

A feedback transistor is coupled to the bitline and provides voltage feedback on the bitline's precharge status. A biasing transistor is coupled to the feedback transistor. The biasing transistor provides a bias voltage to the feedback transistor in response to a reference voltage on the biasing transistor.

A cascode-connected transistor is coupled to the feedback transistor and the biasing transistor. This transistor provides a stable bias voltage to the biasing transistor. An output latch circuit is coupled to the bitline for providing a latched output of the memory cell's data.

Further embodiments of the invention include methods and apparatus of varying scope.

DETAILED DESCRIPTION

Figure 1:
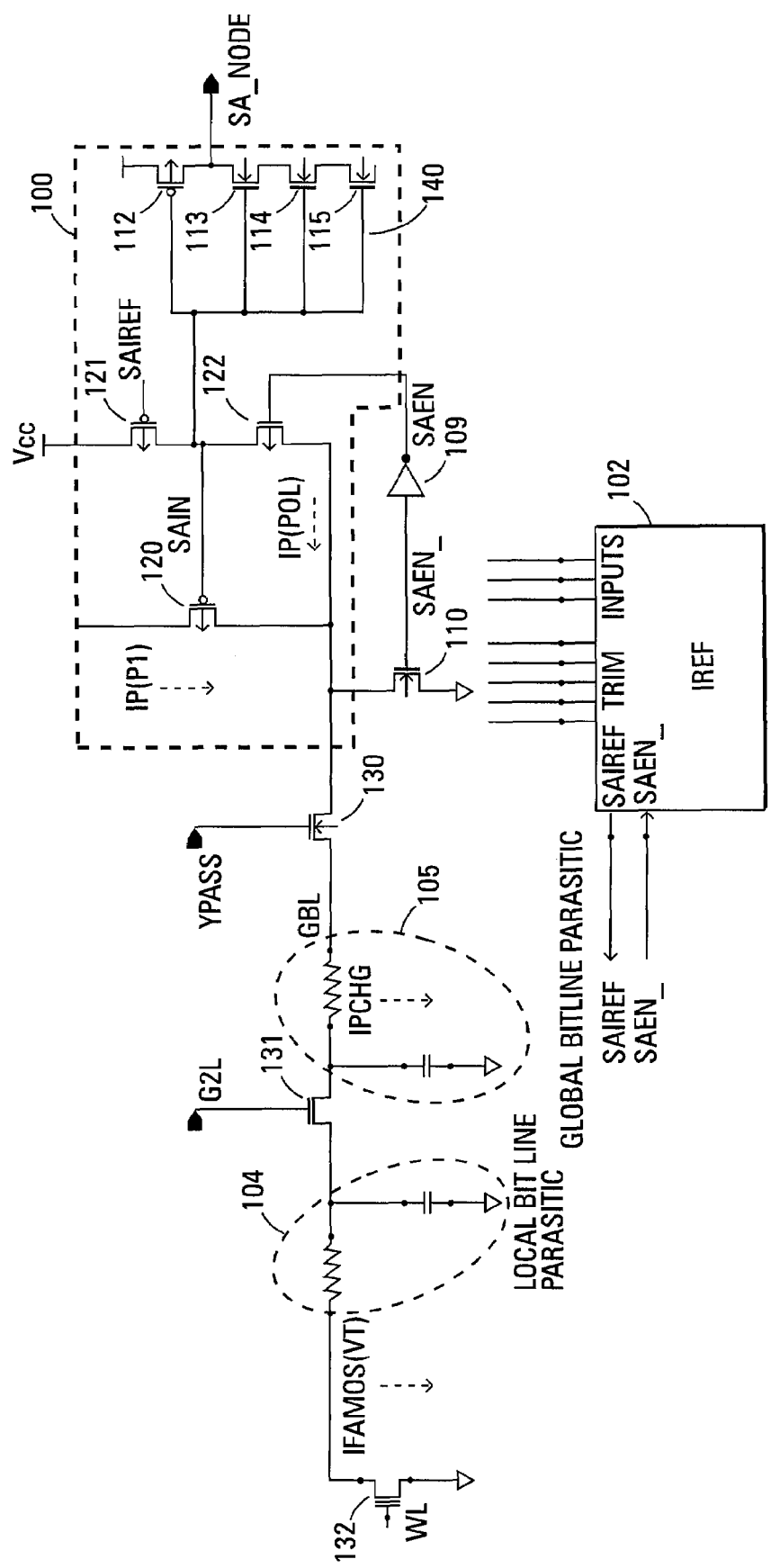
FIG. 1 shows a schematic diagram of one embodiment of a sense amplifier for a flash memory device of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The subsequent discussion of the present invention refers to memory cells. In one embodiment and in the subsequent discussion, these cells are floating gate avalanche metal oxide semiconductors (FAMOS). The present invention, however, is not limited to any one type of memory cell.

FIG. 1 illustrates a schematic diagram for one embodiment of a sense amplifier 100 and supporting circuitry of the present invention. In one embodiment, the sense amplifier 100 is used in a flash memory device. As is well known in the art, the sense amplifier is used during a read or verify operation to compare currents from a selected memory cell with a reference current and output the data. The sense amplifier 100 and support circuitry of the present invention provide rapid detection of the selected memory cell current without the need for external timing signals.

A common decoding scheme may include a number of memory cells coupled to a local bit line, a number of local bit lines selectively coupled to a global bit line, and a number of global bit lines selectively coupled to the sense amplifier. The circuitry of FIG. 1 may be repeated hundreds of thousands or even millions of times, depending on the size of the memory device.

The sense amplifier circuit 100 of the present invention is based on the use of a PMOS transistor 120 that is used in a feedback configuration. The gate of this transistor 120 is coupled to a sense amplifier input (SAIN) connection. The SAIN connection is the input from the memory cell whose data is being read.

Sensing a data value of a memory cell in a flash memory device typically includes a precharging operation where the bitline containing the target memory cell is precharged to some predetermined potential. The potential, in one embodiment, is the supply potential. The bitline precharge operation is well known in the memory art and is not discussed further.

The feedback transistor 120 provides feedback on the bitline precharge status. The feedback is the voltage detected on the drain side of an NMOS transistor 122 used in a cascode configuration. The NMOS cascode transistor 122 provides a stable voltage at the SAIN node. Depending on the value of the SAIN node, the feedback transistor 120 balances the current to inject into the bitline.

YPASS and G2L are column decoding signals that come from decoding circuits according to the selected column address. These signals turn on their respective transistors 130 and 131 to enable the sense amplifier circuit 100. The decoding circuits are well known in the art and are not shown here.

WL is the wordline for the memory cell. It comes from row decoding circuit (not shown) according to the selected row address. The WL signal turns on its respective enable transistor 132 thus allowing IFAMOS($V_T$) to flow. The generation of the wordline signal is well known in the art and is not discussed herein.

The SAEN_signal is the sense amplifier enable signal. This signal is generated by a control circuit that asserts SAEN_(active low) when it is desired to access the memory cell. For example, the SAEN_signal may go low to enable the sense amplifier for read or verify operations.

The SAEN_signal turns on an n-channel transistor 110 to control the current through the sense amplifier 100. The SAEN_signal is also inverted 109 to SAEN for use in controlling an n-channel transistor 122 of the sense amplifier 100. The SAEN signal from the inverter 109 is connected to the control gate of the cascode transistor 122.

The SA_NODE signal is the output of the sense amplifier 100. This signal carries the information about the bit value stored in the memory cell. SA_NODE is coupled to an output of the memory device after, in one embodiment, being latched and buffered.

The node SAIREF comes from an IREF bias circuit 102 that, in one embodiment, is external to the sense amplifier. SAIREF biases the feedback transistor 120 through a biasing p-channel transistor 121 in order to produce the current IP(POL) while SAEN_ is low. This is done in order to prevent the feedback transistor 120 from turning off when active low SAEN_is de-asserted. The SAIREF signal, in one embodiment, is common to the other instances of sense amplifiers of the memory device. The voltage level of the reference voltage SAIREF determines the bias level of the feedback transistor 120.

The bias circuit 102 of the present invention includes SAEN_as an input and SAIREF as an output. Generation of the bias voltage in response to the SAEN_signal is well known in the art and is not discussed further.

The local bit line parasitic capacitance 104 is also indicated in FIG. 1. As is well known in the art, this is the capacitance of the bit line connected to the accessed FAMOS memory cell.

In operation, the feedback transistor 120 provides nearly all of the current (IPCHG) necessary for the precharge of the global bitline capacitance 105 during a precharge operation. IPCHG is the current needed to charge the global bitline parasitic capacitance up to the desired sensing value. In this phase of the sensing operation, the SAIN node rises from approximately 0V up to a maximum of approximately $|V_{CC}-V_{TN}(N1)|$ where $V_{TN}(N1)$ is the threshold voltage of the n-channel MOS transistor 122.

Once the precharge operation is over, the IPCHG current goes to 0 and the IP(P1) current plus the IP(POL) current have to balance only the current sink from the accessed memory cell. At this point in the sensing operation, two different conditions may exist in the sense amplifier. If I(FAMOS)<IP(POL), then the feedback transistor 120 is off. In this case, IP(POL) increases the SAIN node voltage to $V_{CC}$. If I(FAMOS)>IP(POL), the feedback transistor 120 is on. In this instance, the SAIN node stays at approximately $V_{CC}-V_{TN}(N1)$. This is due to the feedback transistor 120 setting the current IP(P1) to balance the I(FAMOS)–I(POL) current.

The last stage of the sense amplifier is a simple inverter 140 with a threshold above $V_{CC}-V_{TN}(N1)$. The inverter 140 is comprised of four transistors 112–115 and is used to detect the SAIN voltage swing.

A minimum threshold voltage of a programmed FAMOS memory cell ($V_{T0MIN}$) can now be identified. Similarly, a maximum threshold voltage of an erased FAMOS memory cell is identified ($V_{T1MAX}$). As is well known in the art, a programmed memory cell is typically a logical 0 while an erased memory cell is typically a logical 1.

$V_{T0MIN}$ and $V_{T1MAX}$ are dependent on multiple factors including: the type of memory cell, the voltage on the wordline during a read operation, the CMOS process used to fabricate the memory, and the particular sense amplifier used. In one embodiment, these threshold voltage values may be determined by choosing a desired minimum current for an erased cell at any temperature and supply voltage operating point. This provides the $V_{T1MAX}$ threshold value. A desired maximum current for a programmed cell is chosen at the any operating temperature and supply voltage to produce the $V_{T0MIN}$ threshold value. In one embodiment, these values are $V_{T1MAX}=3.7V$ and $V_{T0MIN}=4.1V$ at a wordline read voltage of 4.5V and IP(POL)=2 µA.

If the IP(POL) value is set to $(I(V_{T1MAX})-I(V_{T0MIN}))/2$, the SAIN node will be below the threshold point if the addressed memory cell has a threshold voltage $V_T<V_{T1MAX}$. In this case, the memory cell is considered to be erased. If the addressed memory cell has a threshold voltage of $V_T>V_{T0MIN}$, it is considered to be programmed.

Figure 2:
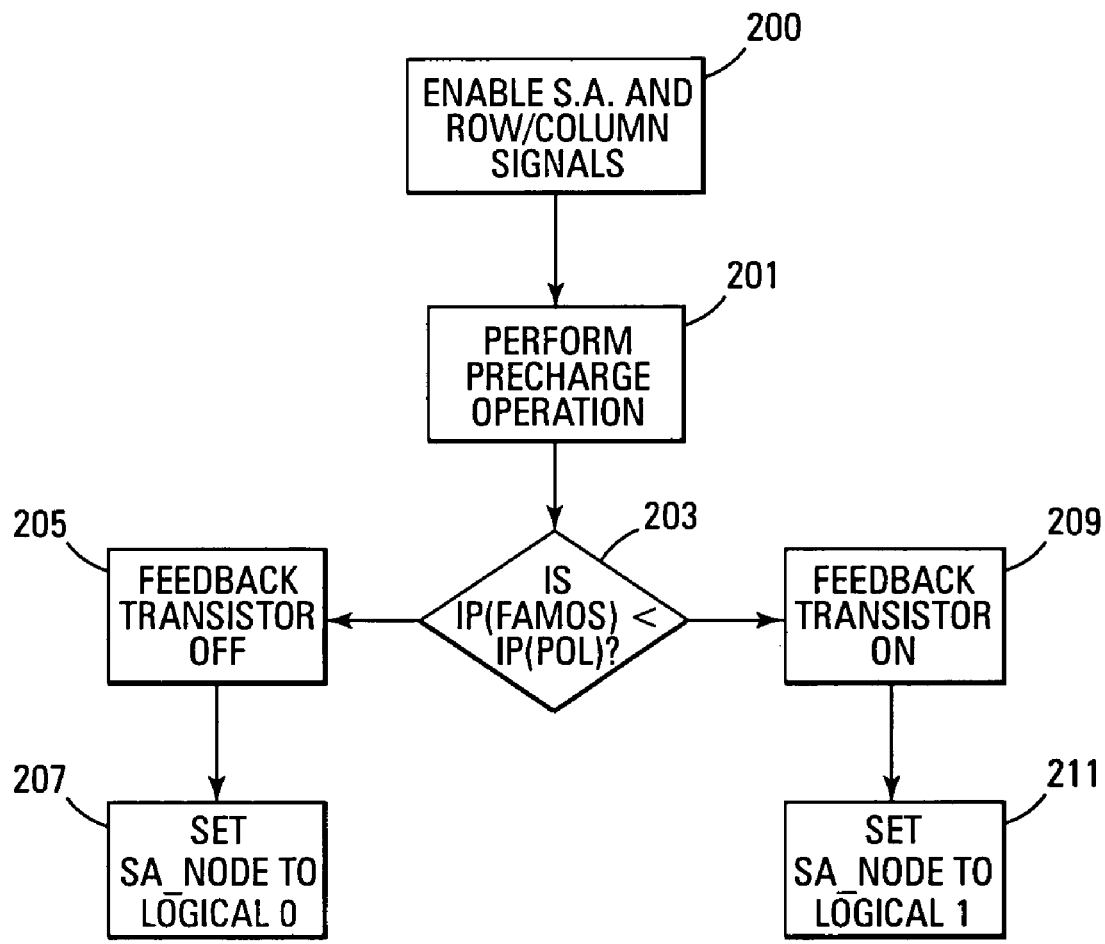
FIG. 2 shows flowchart of one embodiment of a method for sensing data in a non-volatile memory cell.

FIG. 2 illustrates a flowchart of the above-described sense amplifier of the present invention. This method is read in combination with the circuit of FIG. 1.

The method first enables the sense amplifier with a true SAEN_signal. The sense amplifier is typically enabled during an access of the memory cells. For example, a read or verify operation would cause the SAEN_signal to be true.

The column and row select signals are also enabled 200. These signals are typically enabled in response to the memory address of the desired cell or cells being received. The decoding circuitry of the memory device then generates the proper column and row access signals in response to this address.

A precharge operation 201 precharges the bitline of the target memory cell to some predetermined potential. This causes the GBL node of FIG. 1 to be precharged such that, at the beginning of the operation, the node SAIN tracks the GBL node. This reduces the $|V_{gs}|$ of the feedback transistor thus reducing the IP(P1).

After the precharge operation 201, if the detected memory cell current IP(FAMOS) is less than IP(POL) 203, the feedback transistor is off and the SAIN node is at $V_{CC}$ 205. In this case, the SA_NODE is set to a logical 0 207. This value is typically considered to be a memory cell programmed value.

If the detected memory cell current IP(FAMOS) is greater than IP(POL) 203, the feedback transistor is on and the SAIN node stays at approximately $V_{CC}-V_{TN}(N1)$ 209. In this case, SA_NODE is set to a logical 1 211. This value is typically considered to be an erased value.

It can be seen that the SAIN node of FIG. 1 tracks the current from the memory cell starting to discriminate the precharge current without additional delay that is forced from external temporization signals of the prior art. At a given selected value of IP(POL), the SAIN node tends to be very slow when the IP(POL) current matches the IP(FAMOS) current but discriminates very sharply different values of IP(FAMOS).

Figure 3:
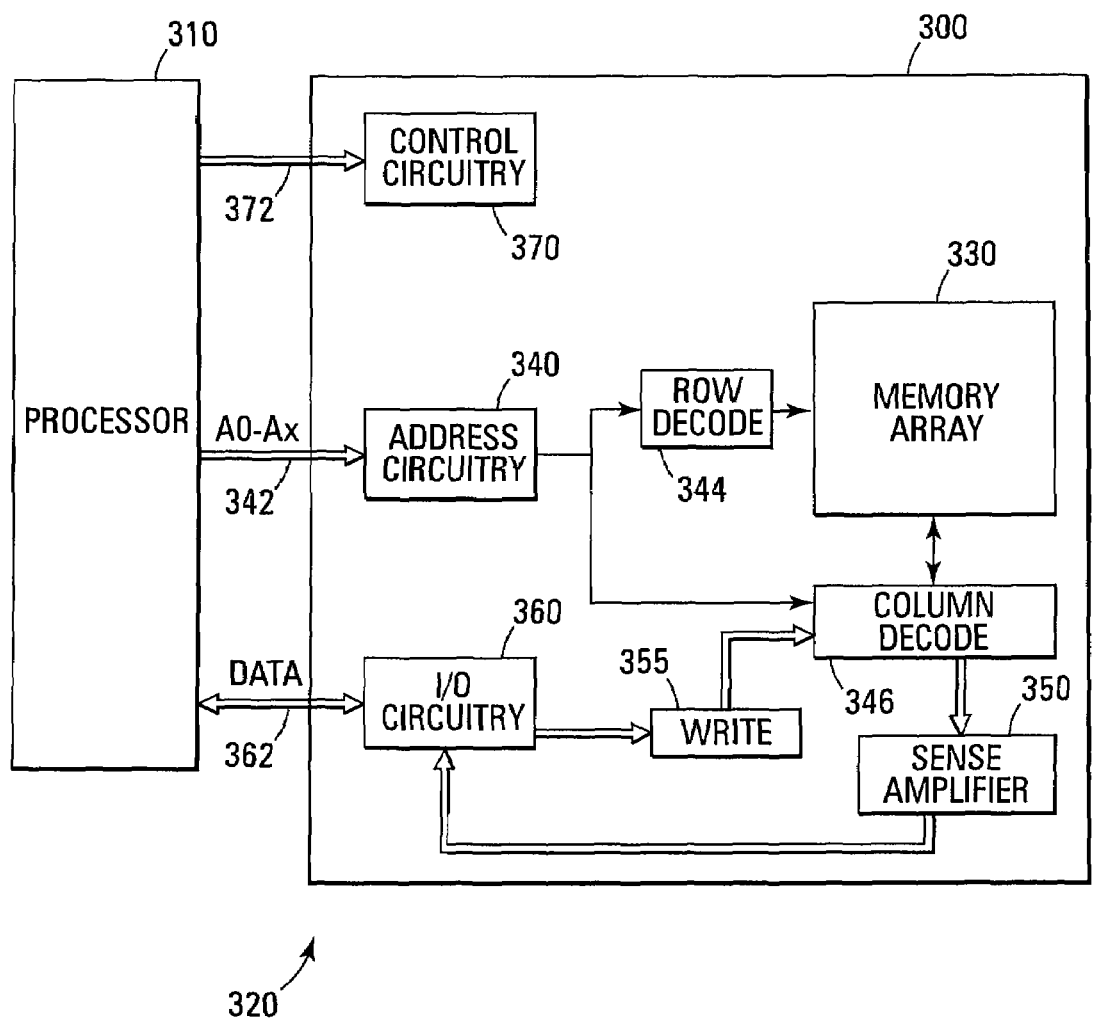
FIG. 3 shows a block diagram of one embodiment of an electronic system incorporating the flash memory device of the present invention.

FIG. 3 illustrates a functional block diagram of a memory device 300 that can incorporate the flash memory cells of the present invention. The memory device 300 is coupled to a processor 310. The processor 310 may be a microprocessor or some other type of controlling circuitry. The memory device 300 and the processor 310 form part of an electronic system 320. The memory device 300 has been simplified to focus on features of the memory that are helpful in understanding the present invention.

The memory device includes an array of flash memory cells 330 that can be floating gate, NROM, or other types of flash memory cells. The memory array 330 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 340 is provided to latch address signals provided on address input connections A0–Ax 342. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using a plurality of sense amplifiers of the present invention 350 as described previously. The sense amplifier circuitry 350, in one embodiment, includes buffer/latch circuitry and is coupled to read and latch a row of data from the memory array 330. Data input and output buffer circuitry 360 is included for bi-directional data communication over a plurality of data connections 362 with the controller 310. Write circuitry 355 is provided to write data to the memory array.

Control circuitry 370 decodes signals provided on control connections 372 from the processor 310. These signals are used to control the operations on the memory array 330, including data read, data write, and erase operations. The control circuitry 370 may be a state machine, a sequencer, or some other type of controller.

The flash memory device illustrated in FIG. 3 has been simplified to facilitate a basic understanding of the features of the memory. A more detailed understanding of internal circuitry and functions of flash memories are known to those skilled in the art.

CONCLUSION

In summary, the sense amplifier circuit of the present invention can be used in a flash memory device to detect the data value of a memory cell. The embodiments of the present invention allows a fast precharge operation of the bitlines. Since a PMOS feedback transistor is used, the last phase of the precharge operation is completed near its $V_{GS}$ that is very close to its $V_T$ voltage. This provides rapid sensing of cell current without the need for externally timed signals. The embodiments of the sense amplifier circuit of the present invention operate with NAND type flash memories, NOR-type flash memories, and other types of non-volatile memories requiring sense amplifiers.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A sense amplifier in a non-volatile memory device comprising a memory cell coupled to a bitline, the sense amplifier comprising:
    a feedback transistor coupled to the bitline for providing feedback on the bitline precharge status;
    a biasing transistor, coupled to the feedback transistor, that provides a bias voltage to the feedback transistor in response to a reference voltage;
    a cascode transistor, coupled to the feedback transistor and the biasing transistor, that provides a stable bias voltage; and
    a latch output circuit coupled to the bitline for providing a latched output of memory cell data.

2. The sense amplifier of claim 1 wherein the feedback transistor is a p-channel MOS transistor.

3. The sense amplifier of claim 1 wherein a gate node of the feedback transistor is coupled to the bitline.

4. The sense amplifier of claim 1 wherein the feedback is a voltage detected on a drain side of the cascode transistor.

5. The sense amplifier of claim 1 wherein the cascode transistor is enabled by a sense amplifier enable signal.

6. The sense amplifier of claim 5 wherein the reference voltage is generated in response to the sense amplifier enable signal.

7. A sense amplifier in a flash memory device comprising a memory cell coupled to a bitline, the sense amplifier comprising:
    a feedback transistor coupled to the bitline for providing voltage feedback on the bitline precharge status;
    a biasing transistor, coupled to the feedback transistor, that provides a bias voltage to the feedback transistor in response to a reference voltage;
    a cascode transistor coupled to the biasing transistor in a cascode configuration and to a gate of the feedback transistor, the cascode transistor providing a stable bias voltage in response to a sense amplifier enable signal;
    a latch output circuit coupled to the bitline for providing a latched output of memory cell data; and
    a plurality of enable transistors that are enabled by row and column decoding signals and a wordline signal.

8. The sense amplifier of claim 7 wherein the flash memory device is a NOR architecture memory device.

9. The sense amplifier of claim 7 wherein the flash memory device is a NAND architecture memory device.

10. The sense amplifier of claim 7 wherein the latch output circuit is comprised of a plurality of transistors coupled in series.

11. The sense amplifier of claim 7 wherein the plurality of enable transistors are coupled in a series configuration.

12. The sense amplifier of claim 7 and further including a sense amplifier enable transistor coupled to the sense amplifier enable signal that enables current to flow through the sense amplifier in response to a state of the sense amplifier enable signal.

13. The sense amplifier of claim 12 and further including an inverter coupled to the sense amplifier enable signal to invert the sense amplifier enable signal prior to being coupled to a gate of the cascode transistor.

14. A method for sensing data in a memory cell coupled to a sense amplifier through a bitline, the method comprising:
generating column and row select signals in response to an address of the memory cell;
generating a sense amplifier enable signal in response to an access operation of the memory cell;
precharging the bitline to a predetermined sensing voltage; and
providing analog, negative feedback on bitline precharge status.

15. The method of claim 14 wherein the bitline precharge status is a detected voltage from a transistor coupled to the bitline.

16. The method of claim 14 wherein providing the analog, negative feedback includes balancing current injected into the bitline.

17. The method of claim 14 and further including:
generating a reference voltage in response to the sense amplifier enable signal; and biasing, in response to the reference voltage, a negative feedback transistor that provides the analog, negative feedback on the bitline precharge status.

18. A method for sensing data in a memory cell coupled to a sense amplifier through a bitline, the method comprising:
generating column select, row select, and sense amplifier signals in response to an access operation of the memory cell;
generating a reference voltage in response to the sense amplifier enable signal;
a bias transistor biasing, in response to the reference voltage, a feedback transistor;
precharging the bitline to a predetermined sensing voltage;
providing feedback on bitline precharge status;
detecting current from the memory cell;
if the detected current is less than a predetermined threshold current, setting an output of the sense amplifier to a logic 0; and
if the detected current is greater than the predetermined threshold current, setting the output of the sense amplifier to a logic 1.

19. The method of claim 18 wherein when the feedback transistor turns on, the bitline precharge status voltage is a value substantially equal to $V_{CC}-V_{TN}$ wherein $V_{CC}$ is a supply voltage for the sense amplifier and $V_{TN}$ is a threshold voltage of a cascode-coupled transistor coupled to the bias transistor.

20. The method of claim 19 wherein when the feedback transistor is off, the bitline precharge status voltage is a value substantially equal to $V_{CC}$.

21. A non-volatile memory device comprising:
a plurality of memory cells;
a plurality of bitlines coupled to the memory cells; and
a plurality of sense amplifiers, each sense amplifier coupled to a bitline, each sense amplifier comprising:
a feedback transistor coupled to a first bitline for providing feedback on the bitline precharge status;
a biasing transistor, coupled to the feedback transistor, that provides a bias voltage to the feedback transistor in response to a reference voltage;
a cascode transistor, coupled to the feedback transistor and the biasing transistor, that provides a stable bias voltage; and
a latch output circuit coupled to the bitline for providing a latched output of memory cell data.

22. The memory device of claim 21 wherein the sense amplifier provides output of the memory cell data in response to an addressed memory cell of the plurality of memory cells.

23. The memory device of claim 21 wherein each of the plurality of memory cells is a floating gate avalanche metal oxide semiconductor.

24. The memory device of claim 21 wherein the feedback transistor is a PMOS.

25. An electronic system comprising:
a processor for generating memory address and control signals; and
a non-volatile memory device coupled to the processor, the memory device comprising:
a plurality of memory cells;
a plurality of bitlines coupled to the memory cells; and
a plurality of sense amplifiers, each sense amplifier coupled to a bitline, each sense amplifier comprising:
feedback transistor coupled to a first bitline for providing feedback on the bitline precharge status;
a biasing transistor, coupled to the feedback transistor, that provides a bias voltage to the feedback transistor in response to a reference voltage;
a transistor that is cascode-coupled the biasing transistor and coupled to the feedback transistor to provide a stable bias voltage to the feedback transistor; and
a latch output circuit coupled to the bitline for providing a latched output of memory cell data.

26. The system of claim 25 wherein the sense amplifier operates in response to a sense amplifier enable signal that is generated from the memory address and control signals.

27. The system of claim 26 wherein and further including:
a sense amplifier enable transistor coupled to the sense amplifier enable signal that enables current to flow through the sense amplifier in response to a state of the sense amplifier enable signal; and
an inverter coupled to the sense amplifier enable signal to invert the sense amplifier enable signal prior to being coupled to a gate of the cascode-coupled transistor.

* * * * *